United States Patent [19]
Wong

[11] Patent Number: 5,978,276
[45] Date of Patent: Nov. 2, 1999

[54] ELECTRICALLY ERASABLE NONVOLATILE MEMORY

[75] Inventor: Ting-wah Wong, Cupertino, Calif.

[73] Assignee: Programmable Silicon Solutions, Sunnyvale, Calif.

[21] Appl. No.: 09/137,476

[22] Filed: Aug. 20, 1998

Related U.S. Application Data

[63] Continuation-in-part of application No. 08/838,856, Apr. 4, 1997, Pat. No. 5,822,249.

[51] Int. Cl.$^6$ .................................................. G11C 16/04
[52] U.S. Cl. ................................ 365/185.29; 365/185.18; 365/185.27; 365/218
[58] Field of Search ................ 365/185.18, 185.29, 365/218, 185.27; 257/321

[56] References Cited

U.S. PATENT DOCUMENTS

| | | | |
|---|---|---|---|
| 5,235,544 | 8/1993 | Caywood | 365/185 |
| 5,341,342 | 8/1994 | Brahmbhatt | 365/182 |
| 5,349,220 | 9/1994 | Hong | 257/322 |
| 5,416,738 | 5/1995 | Shrivastava | 365/185 |
| 5,457,652 | 10/1995 | Brahmbhatt | 365/185.06 |
| 5,657,271 | 8/1997 | Mori . | |
| 5,677,868 | 10/1997 | Takahashi et al. | 365/185 |
| 5,742,541 | 4/1998 | Tanigami et al. | 365/185.3 |

FOREIGN PATENT DOCUMENTS 09027560  2/1997  Japan .

*Primary Examiner*—David Nelms
*Assistant Examiner*—Tuan T. Nguyen
*Attorney, Agent, or Firm*—Trop, Pruner, Hu & Miles, P.C.

[57] ABSTRACT

A nonvolatile memory cell which is highly scalable includes a cell formed in a triple wall. The control gate is negatively biased. By biasing the P-well and drain (or source) positively within a particular voltage range when erasing, GIDL current and degradation from a hole trapping can be diminished and hence scalable technology may be achieved.

29 Claims, 1 Drawing Sheet

ELECTRICALLY ERASABLE NONVOLATILE MEMORY

CROSS-REFERENCE TO RELATED APPLICATION

This application is a continuation-in-part of U.S. patent application Ser. No. 08/838,856 filed Apr. 4, 1997, now U.S. Pat. No. 5,822,249.

BACKGROUND

This invention relates generally to nonvolatile memories and particularly to electrically erasable nonvolatile memories.

Nonvolatile memory cells are advantageous since they retain recorded information even when the power to the memory is turned off. There are several different types of nonvolatile memories including erasable programmable read only memories (EPROMs), electrically erasable and programmable read only memories (EEPROMs) and flash EEPROM memories. EPROMs are erasable through light exposure but are electrically programmable by channel hot electron injection onto a floating gate. Conventional EEPROMs have the same programming functionality, but instead of being light erasable they can be erased and programmed by electron tunneling. Thus, information may be stored in these memories, retained when the power is off, and the memories may be erased for reprogramming, as necessary, using appropriate techniques. Flash EEPROMs may be block erased, typically giving them better read access times than regular EEPROMs.

Currently, flash memories have gained considerable popularity. For example, flash memories are often utilized to provide on-chip memory for microcontrollers, modem and SMART cards and the like where it is desirable to store codes that may need fast updating.

While flash memories and EEPROMs are closely related, in many instances flash memories are preferred because their smaller cell size means that they can be made more economically. However, flash memories and EEPROMs often have very similar cell attributes.

When EEPROMs are erased, one or more of cells are erased in one operation. A high positive potential is applied to the cell sources and/or drain while the control electrode and the substrate are grounded. As a result, negative charges on the floating gate are drawn to the source and/or drain region by Fowler-Nordheim tunneling. This technique is effective where the dielectric between the floating gate electrode and the source and/or drain regions is very thin.

A number of disadvantages arise from the conventional erasing technique, including the fact that it creates the possibility of a reverse voltage breakdown between the source and/or drain and substrate junctions which would cause hot hole trapping in oxide and reliability problems. Chi Chang, et al. "Drain Avalanche and Hole Trapping Induced Gate Leakage in Thin Oxide MOS Devices," IEEE Electron Device Letters, Vol. 9, 1988, pp. 588–90. To overcome this, some designers have used a so-called double diffused junction to enhance the junction substrate breakdown voltage. However, the double diffused junction has certain disadvantages, including (1) the fact that it may require additional cell size, reducing the potential cell density and (2) it still has Gate Induced Drain Leakage (GIDL) current. Another potential solution is the use of relatively high negative potentials on the control gate and hence less voltage is applied to the source. Sameer S. Haddad et al. U.S. Pat. No. 5,077,691 titled, "Flash EEPROM Array with Negative Gate Voltage Erase Operation." This in turn would reduce the field across the source to substrate junction.

However, as channel lengths become small this hole trapping becomes channel length dependent. This effect has been described as a possible "fundamental limitation to the scaling of flash memory cells". Jian Chen, et al., "Short Channel Enhanced Degradation During Discharge of Flash EEPROM Memory Cell", IEDM 1995 - 331, 13.6.1–13.6.4. That article indicates that during the discharge stress, the holes generated from band-to-band tunneling travel through the silicon-to-silicon dioxide interface, are accelerated by the strong lateral electric field, and gain sufficient energy to become energetic hot holes. The article explains that a negative gate voltage pulls these energetic hot holes to the gate causing them to bombard the surface, get trapped and create interface states. As channel length decreases, the lateral field increases, exacerbating the effect.

The article suggests that the problem may be avoided by increasing the channel length. Since this solution is counter to the longstanding industry trend of scaling devices to increasingly smaller and smaller sizes resulting in lower cost products in smaller dimensions, this solution is not particularly desirable. Chen, et al. suggests that another solution to the problem is to apply a positive bias to the drain while discharging the cell from the source node. While the results discussed in the article indicate that this does improve the problem to a certain degree, some of the degradation appears to remain, even when this approach is used.

It has also been suggested that using channel erase with a large negative voltage applied to the control gate and a voltage of five volts applied to a P-well and an N-well could improve gate disturb tolerance and reliability due to the decrease in hot hole generation near the source region. See, T. Jinbo, et al., "A 5-V-Only 16-Mb Flash Memory with Sector Erase Mode", 1992 IEEE Journal of Solid-State Circuits, Vol. 27, No. 11, November 1992 at pages 1547–1554. This requires a negative gate voltage that is about ⅓ higher than that in the drain erasure situation (the Haddad, et al. U.S. Pat. No. 5,077,691). See, Hsing-jen Wan, et at., "Suppressing Flash EEPROM Erase Leakage with Negative Gate Bias and LDD Erase Junction," Proc. of IEEE VLSI Technology Symposium (Japan) May 1993, p. 81–2.

The inventor of the present invention believes that none of these approaches is fully satisfactory and that there is a continuing need for an efficient, scalable erase mechanism. Thus, while those skilled in this art have appreciated a number of advantages that could accrue from the use of a negative control gate potential in connection with EEPROM erase cycles, a variety of deficiencies have discouraged those of skill in this art from pursuing those advantages.

SUMMARY

In accordance with one aspect of the present invention, a nonvolatile memory cell is formed in a P-type region. The memory cell also includes a transistor having a floating gate and a control gate and a pair of doped regions acting as a source and a drain formed in the P-type region. The floating gate is erasable by tunneling of electrons from the floating gate to one of the doped regions. The P-type region and one of the doped regions are biased separately by positive potentials. The difference between the doped region bias and the P-type region potential is less than Vcc and greater than zero. The control gate is negatively biased.

In accordance with yet another aspect of the present invention, a method for erasing a memory cell having a control gate, a floating gate, a channel, and a pair of doped regions acting as a source and drain formed in a P-well in turn formed in an N-well, includes the step of negatively biasing the control gate. The P-well and one of the doped regions are positively biased such that the doped region bias minus the P-well bias is less than Vcc and more than zero.

DETAILED DESCRIPTION

Figure 1:
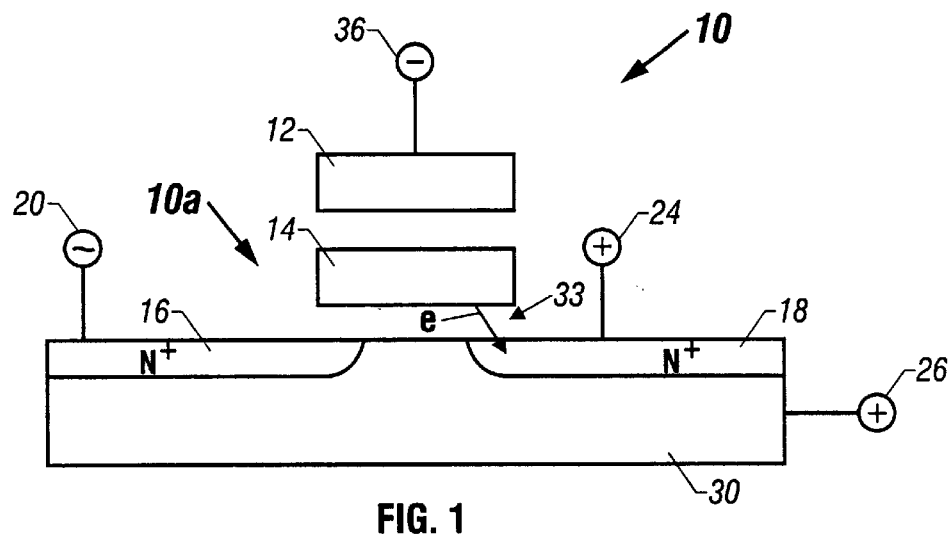
FIG. 1 is a schematic depiction of a cell configuration for one embodiment.

Referring to the drawing wherein like reference characters are used for like parts throughout the several views, a memory cell 10, shown in FIG. 1, includes a control gate 12 and a floating gate 14. This structure is advantageously implemented on a semiconductor layer 30 having situated thereon an electrically isolated floating gate 14. However, the particular cell structure is not critical and the present invention could be implemented using a variety of memory cell structures, including, for example, split gate and stacked gate cell structures.

The substrate 30, which may be a P-type semiconductor, includes a heavily doped source region 16 and a heavily doped drain region 18. The regions 16 and 18 could also include lightly doped drain (LDD) extensions (not shown). The drain bias potential 24, the substrate bias potential 26, the source potential 20 and gate bias potential 36 may be tailored to maximize the performance of the cell.

The cell 10 may be read and programmed using any known technique. The bias potentials illustrated in FIG. 1 are for implementing a Fowler-Nordheim tunneling of electrons from the floating gate 14 primarily to the drain 18, as indicated by the arrow "e".

During erasure, the control gate 12 is forced to a negative voltage of from −7 to −14 volts, with the source bias potential 20 equal to or greater than the P-well potential. By keeping the control gate bias more positive than −11 volts, the process for forming the cell can be made more compatible with standard logic processes. By making the source 20 potential equal to or greater than the P-well potential the lateral electric field is reduced, reducing band to band tunneling induced hole trapping. Advantageously, the source bias potential is between the P-well and drain bias potentials. Alternatively, the source may float.

As for the drain diffusion 18, and the substrate 30, they are biased to a positive potential close to Vcc or higher. Vcc is determined by the particular technology utilized. For example, it could be 5.0 to 1.8 volts with present technologies. This reduces the electric field across the junction between the N+ diffusion 18 and the substrate 30. The reduced GIDL current and the lateral electric field prevents acceleration of hot hole trapping in the gate oxide under the floating gate 14.

The drain 18 is preferably not biased to a voltage higher than the substrate 30 bias to such an extent that gate induced drain leakage (GIDL) becomes a problem. With current technologies, this means that the drain 18 bias is advantageously not higher than the substrate 30 bias by more than about one to two volts. See S. Parke, et al., "Design for Suppression of Gate-induced Drain Leakage in LDD MOSFETs using a Quasi-two-dimensional Analytical Model," IEEE Transactions on Electron Devices, vol. 39, p. 1694–1703, 1992, hereby expressly incorporated by reference herein. In addition, if the drain 18 bias significantly exceeds the substrate 30 bias, hot hole trapping may occur due to the lateral junction field acceleration. In general, it is preferred that the drain 18 bias minus the substrate 30 bias be greater than zero and less than Vcc.

Figure 2:
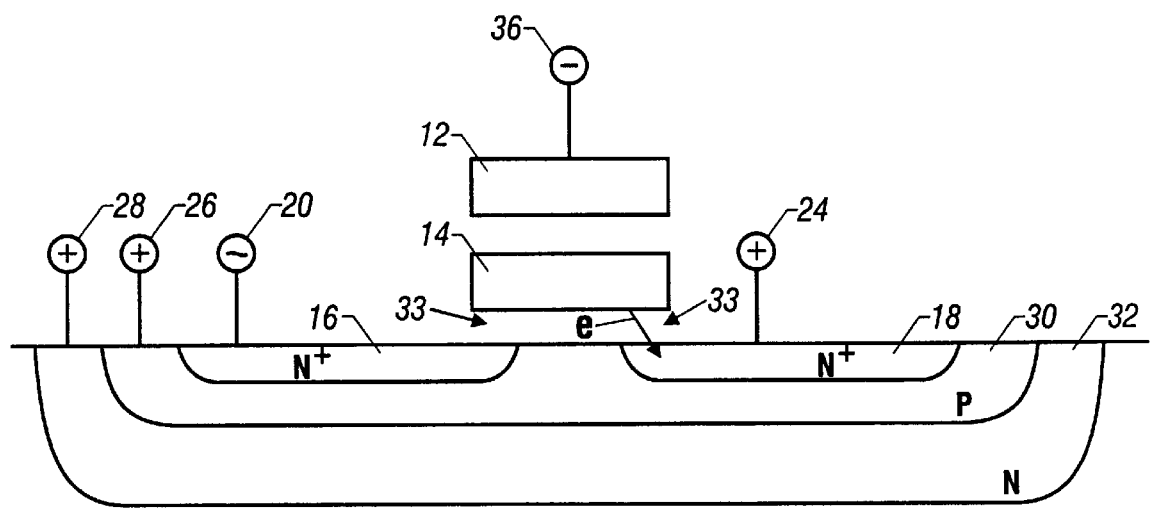
FIG. 2 is a schematic depiction of a cell configuration for another embodiment.

The ability to apply a positive voltage to the substrate 30 is facilitated by using a P-well 30 embedded in an N-well 32, as shown in FIG. 2. The P-well voltage 26 is preferably equal to or less than N-well potential 28 to avoid P-well/N-well forward biasing. Thus, applying a positive voltage of Vcc or higher to the P-well 30, N-well 32 and the drain 18 can eliminate hot hole trapping induced by GIDL while allowing the drain 18 voltage to be raised to Vcc or higher. Preferably, the drain bias minus the P-well bias is greater than zero and less than Vcc or at least greater than zero and equal to or less than Vcc.

The voltage across the capacitor 33 is the difference between the floating gate 14 potential on the one hand and the diffusion 18 and P-well 30 potentials. When the difference exceeds 8 to 10 volts, sufficient tunneling current is generated and the floating gate 14 can be erased to a negative potential in the time frame of a few milliseconds to a few seconds, depending on the tunneling oxide 42 thickness.

Electrons tunnel to the drain region 18 (drain erase). The tunneling current depends on the voltage from the floating gate 14 to the drain 18. However, by biasing the source 16 in the fashion illustrated for the drain 18, a source erase mechanism may be provided instead of the drain erase mechanism. During source erase, the drain potential would be controlled in the same fashion as the source potential in the drain erase case.

The cells 10 and 10a may be formed using conventional process technologies such as a double poly, single metal CMOS process. The illustrative parameters set forth herein contemplate a 0.35 μm or lower feature size with Vcc potentials of 1.8 volts. As the technology permits lowering voltages and smaller feature sizes, the parameters herein would scale accordingly.

The starting substrate material is typically P-type (100) silicon, for example having a resistivity in the range of 10–20 ohm-cm. The P-well 30 is embedded in an N-well 32 in the so-called triple well process. The P-well 30 has a typical well depth of, for example, 2 to 4 um with an average doping concentration, for example, in the range of $1\times10^{16}$ to $5\times10^{16}$ atoms per cubic centimeter.

The N-well 32 has a typical well depth of, for example, 4–8 um. The doping concentration may be from $4\times10^{15}$ to $1\times10^{16}$ atoms per cubic centimeter. The triple well is formed by the P-well 30 counterdoping the N-well 32.

The formation of the elements in the triple well is as follows. An N-well implant is done, for example, with phosphorous P31 with a typical dose of 1 to $1.5\times10^{13}$ atoms per square centimeter and an energy from about 160 to 100 Kev. The N-well implant is driven using a high temperature step which may typically be 6 to 12 hours at 1125 to 1150° C. The N-well 32 is then counterdoped with a P-well implant. Typical dosages for the P-well implant could be 1.5 to $2.5\times10^{13}$ atoms per square centimeter with an energy of 30 Kev to 180 Kev using a species such as boron B11. The N-well 32 and P-well 30 are then driven, typically 6 to 10 hours at 1125 to 1150° C. This sets the wells to the desired doping concentrations and depths. After the well formation, formation of field oxide and field isolation follows using a standard logic field process. The field oxide thickness and field doping may be slightly adjusted to satisfy the cell programming requirements. After this, a memory cell implant may be performed. For example, a B11 implant at 30 to 50 Kev with a dose of 1.0 to $3.5 \times 10^{13}$ atoms per square centimeter may be done through a sacrificial oxide. The gate is then formed. For example, an 85 to 100 Angstrom dry oxide may be grown across the wafer. A dry oxide is grown, for example, at 900° C. in partial oxygen followed by a 975 to 1050° C. anneal.

The floating gate 14 may then be formed of polysilicon, silicide or metals. If polysilicon is used, it can be 1600 Angstroms thick, and POCL3 doped at 870 to 1000° C. The interpoly dielectric is formed of an oxide-nitride-oxide sandwich (ONO) with the lower oxide being from 60 to 80 Angstroms, the nitride layer having a thickness of from 90 to 180 Angstroms and the upper oxide being from 30 to 40 Angstroms. The polysilicon (poly 2) for the control gate 12 may then be deposited and silicided if desired. The gates are patterned and defined using standard self-aligned gate etching techniques.

With the completion of these capacitor and transistor structures, all subsequent processing for contacts and interconnect layers follows standard logic rear end processing.

The present invention is particularly desirable with technologies having 0.35 μm feature sizes or less with a Vcc of 3.3 volts or less. At these sizes, GIDL creates a hole trapping problem which adversely affects reliability and causes drain leakage which adversely affects the power supply. Thus, it is desirable under these conditions to minimize GIDL to reach the smallest feature sizes. This can be done by making the P-well and drain bias voltages the same. However, this penalizes the erase current. By making it possible that the P-well voltage and drain voltage are different voltages, the GIDL leakage current can be made tolerable, while optimizing the P-well potential for tunneling erasure. Thus, the P-well potential can be selected to allow a less negative control gate voltage while achieving excellent GIDL and erase conditions. The lower control gate potential makes the technology more compatible with standard logic procedures.

At a Vcc of greater than 2.5 volts, it is advantageous to maintain the difference between the drain bias and the P-well bias at 2.5 volts to about Vcc. At a Vcc of less than 2.5 volts, the difference between the drain bias and the P-well bias is advantageously maintained in the range from 0 to Vcc.

While a number of parameters and levels were provided in the foregoing description, those skilled in the art will appreciate that these parameters and levels are merely for illustration purposes. It is intended that the appended claims cover all modifications and variations as fall within the true spirit and scope of the present invention.

What is claimed is:

1. A nonvolatile memory cell formed in a P-type region, comprising:
    a transistor having a floating gate, a control gate, and first and second doped regions acting as a source and a drain formed in said P-type region;
    said floating gate being erasable by tunneling of electrons from said floating gate to said first doped region with said P-type region and said first doped regions being positively biased such that the difference between said first doped region bias and the P-type region bias is less than or equal to Vcc and greater than zero;
    a negative bias on the control gate; and
    said second doped region being biased by a potential equal to or more positive than the P-type region bias potential.

2. The cell of claim 1 wherein said P-type region is contained within an N-well and said N-well is biased positively.

3. The cell of claim 2 wherein said P-type region and said first doped region are biased to Vcc or higher, but equal to or less than the N-well bias.

4. The cell of claim 1 wherein said P-type region is a P-well embedded in an N-well.

5. The cell of claim 1 wherein said drain is the first doped region.

6. The cell of claim 1 wherein said difference is less than Vcc.

7. The method for erasing a memory cell having a control gate, a floating gate, a channel, and first and second doped regions acting as a source and a drain formed in a P-well in turn formed in an N-well, said method comprising the steps of:
    negatively biasing said control gate;
    positively biasing said P-well;
    positively biasing said first doped region such that said first doped region bias minus the P-well bias is less than or equal to Vcc and greater than zero; and
    biasing said second doped region using a potential equal to or more positive than said P-well bias.

8. The method of claim 7 including the step of causing electrons to be discharged to said first doped region.

9. The method of claim 7 including the step of positively biasing said N-well.

10. The method of claim 7 including the step of biasing the first doped region to about Vcc or higher.

11. The method of claim 7 including the step of biasing the P-well to about Vcc or higher.

12. The method of claim 7 including the step of biasing the N-well to about Vcc or higher.

13. The method of claim 7 including the step of biasing the control gate to a negative potential more positive than −11 volts.

14. The method of claim 7 including the step of making the difference between the first doped region and P-well bias potentials equal to about 1 to 2 volts.

15. The method of claim 7 wherein positively biasing said first doped region involves positively biasing said drain.

16. The method of claim 7 including the steps of biasing the P-well and biasing the first doped region to a potential equal to or less than the P-well bias potential.

17. A nonvolatile memory cell formed in a P-type region, comprising:
    a transistor having a floating gate, a control gate, and first and second doped regions acting as a source and a drain formed in said P-type region;
    said floating gate being erasable by tunneling of electrons from said floating gate to said first doped region with said P-type region and said first doped regions being positively biased such that the difference between said first doped region bias and the P-type region bias is less than or equal to Vcc and greater than zero;
    a negative bias on the control gate; and
    said P-type region and said first doped region are biased to Vcc or higher, but equal to or less than the N-well bias.

18. The cell of claim 17 wherein said P-type region is contained within an N-well and said N-well is biased positively.

19. The cell of claim 17 wherein said P-type region is a P-well embedded in an N-well.

20. The cell of claim 17 wherein said drain is the first doped region.

21. The method for erasing a memory cell having a control gate, a floating gate, a channel, and first and second doped regions acting as the source and drain formed in a P-well in turn formed in an N-well, said method comprising the steps of:

negatively biasing said control gate;

positively biasing said P-well;

positively biasing said first doped region such that said first doped region bias minus the P-well bias is less than or equal to Vcc and greater than zero; and biasing the P-well and the first doped region to Vcc or higher but equal to or less than the N-well bias.

22. The method of claim 21 including the step of causing electrons to be discharged to said first doped region.

23. The method of claim 21 including the step of positively biasing said N-well.

24. The method of claim 21 including the step of biasing the N-well to about Vcc or higher.

25. The method of claim 21 including the step of biasing the control gate to a negative potential more positive than −11 volts.

26. The method of claim 21 including the step of making the difference between the first doped region and P-well bias potentials equal to about 1 to 2 volts.

27. The method of claim 21 wherein positively biasing said first doped region involves positively biasing said drain.

28. A nonvolatile memory cell formed in a P-type region, comprising:

a floating gate, a control gate, and first doped region acting as a source or a drain formed in said P-type region;

said floating gate being erasable by tunneling of electrons from said floating gate to said first doped region with said P-type region and said first doped region being positively biased such that, if Vcc is less than 2.5 volts, the difference between said first doped region bias and the P-type region bias is less than or equal to Vcc and greater than zero and, if Vcc is greater than 2.5 volts, then the difference between said first doped region bias and the P-type region bias is less than or equal to Vcc and greater than 2.5 volts; and a negative bias on the control gate.

29. The cell of claim 28 wherein said difference is less than Vcc.

* * * * *